United States Patent [19]

Bevilacqua et al.

[11] 4,257,823
[45] Mar. 24, 1981

[54] DIRECT CONVERSION SOLAR ELECTRIC GENERATOR

[75] Inventors: Silvio Bevilacqua; Renato Gislon, both of Rome, Italy

[73] Assignee: Comitato Nazionale per l'Energia Nucleare-CNEN, Rome, Italy

[21] Appl. No.: 39,368

[22] Filed: May 16, 1979

[30] Foreign Application Priority Data

Jun. 2, 1978 [IT] Italy ............................ 49677 A/78

[51] Int. Cl.³ .......................................... H01T 35/00
[52] U.S. Cl. ................................... 136/206; 310/306
[58] Field of Search ...................... 136/206; 310/306

[56] References Cited

U.S. PATENT DOCUMENTS

| Re. 25,242 | 9/1962 | Toulman, Jr. | 136/206 |
| 2,984,696 | 5/1961 | Shaffer | 136/206 |
| 3,026,439 | 3/1962 | Geer | 136/206 X |
| 3,070,643 | 12/1962 | Toulman, Jr. | 136/206 |
| 3,508,089 | 4/1970 | Cheshire | 136/206 |
| 4,147,561 | 4/1979 | Knight | 136/206 |

Primary Examiner—Leland A. Sebastian
Attorney, Agent, or Firm—Stevens, Davis, Miller & Mosher

[57] ABSTRACT

A solar electric generator comprises a concentrator of the sun radiation consisting of a system of lenses which focalize the sun radiation into a vessel of which the bottom—that is the wall opposite to the radiation inlet—comprises a thermoionic stage, that is a high temperature electron emitter and a collector which are separated by a low pressure gaseous mixture. At thermal contact with the receiver of the thermoionic stage, a thermoelectric stage is provided, that is a plurality of couples of semiconductor material bars, one of the P type and the other of the N type. One of the ends of each couple is in contact with the collector of the thermoionic stage and the other end is in contact with a heat draining means for transferring the heat from the thermoelectric stage to the atmosphere.

The electrical output from said two stages is taken out of the generator and suitably transformed to meet the user's requirement.

17 Claims, 6 Drawing Figures

DIRECT CONVERSION SOLAR ELECTRIC GENERATOR

The present invention relates to a high efficiency solar electricity generator which is low cost, compact, low weight, readily transportable and installable with an output power of the order of a Kw which generator is assemblable as a modular unit into higher power plants.

Solar thermoelectric generators are known that is solar generators based only on the Seebeck effect. They are low efficiency devices which consequently imply extensive and costly plants for collecting the solar energy.

Solar thermoionic generators are also known, that is solar generators whereby the collected solar heat is transformed into electric power through electron emission from an electrode which is heated by the sun's radiation, which electrons are collected on a colder electrode.

The efficiency of such generators is too low for producing electric power at a reasonable cost.

According to this invention the thermoelectric and thermoionic effects are jointly exploited in the same solar generator which is based on the coupling in cascade of a thermoionic stage and a thermoelectric stage. By such stage coupling, in the embodiment of this invention to be discussed hereinafter, efficiencies of the order of 30% can be attained in the conversion of the sun's radiant energy into electric power. Such result is attained also by the means adopted for the concentration of the solar energy on the converter proper of the energy.

The generator which is the object of this invention comprises:
(a)—a concentrator of the sun's radiation;
(b)—a receiver of the sun's radiation;
(c)—a conversion thermoionic stage;
(d)—a conversion thermoelectric stage
(e)—a heat draining device;
(f)—a delivery and storage stage of the electric power;
(g)—a pointing and following system.

The functions and structure of the said assemblies will now be described.

(a) The concentrator's function is for focalizing the sun's radiation in such a way that a temperature of at least 1000° C. is attained as required for the operation of the thermoionic stage with an acceptable efficiency.

Many concentrators based either on mirrors or lenses as proposed or developed by various research centers or by the industry can be employed.

(b) The receiver function is for collecting the radiation from the concentrator and transforming it into thermic power.

It substantially comprises a hollow metal body with any exterior shape. In order to increase the conversion efficiency of the radiation energy into thermic energy, a plurality of elements with absorbing and reflecting surfaces can be provided inside the receiver. The receiver opening for the admittance of the radiation thereinto is enough small to render the energy fraction negligible which is reirradiated therethrough. The receiver surfaces not useful for the conversion of thermic into electric energy are thermally insulated for minimizing the energy dispersion.

(c) The thermoionic conversion stage function is for converting the thermal energy from the receiver into dc power with the highest possible efficiency.

It comprises schematically a high temperature electrode (emitter) which emits electrons and a lower temperature electrode (collector) which collects the electrons from the emitter.

Said two electrodes are separated by an interelectrode space where a low pressure gaseous mixture is provided of which the main purpose is for improving the electron emission and absorption and for neutralizing the space charge. An amount of the thermic energy which flows through the thermoionic stage is transformed into electrical power with an efficiency of the order of 20%; the electrical energy can be made available at the outside of the thermoionic stage by means of electrical connections with the emitter and collector which function respectively as the positive and negative poles of this stage of the electricity generator.

In the generator herein disclosed a thermoionic stage of the second generation is employed, that is a stage which is characterized by low operating temperatures of the emitter—lower than 1300° C.—by low values of the collector work function—about 1.2 eV—by low interelectrode voltage drop—lower than 0.5 V. In order to obtain the above performances the following materials can be used: for the emitter: refractory metals such as tungsten, molybdenum and tantalium; for the collector: titanium, niobium, nikel and silicon which may be lined with a thin layer of oxide.

A mixture of cesium and gaseous additives can be used to form the atmosphere within the interelectrode space.

(d) The thermoelectric stage function is for exploiting the thermal drop across the thermoionic stage collector and the environment temperature or more specifically the temperature of the means for draining heat from the thermoelectric stage into the surrounding atmosphere, which will be discussed in the following paragraph (e).

The thermoelectric conversion stage comprises mainly a plurality of couples of semiconductor material bars, one of the P type and the other of the N type. One of the ends of each couple is in contact with the collector of the thermoionic stage and the other end is in contact with the means for draining heat to the atmosphere. Thus the heat from the thermoionic stage flows axially along the bar, whereby a thermal gradient sets up along the bar, the top end thereof, in contact with the thermoionic collector, being hotter than the opposite bottom end. Due to such temperature differences, a voltage can be derived from said couples of bars. The single couples may be connected in series or in parallel or in series parallel according to the user's requirement. In order to exploit the whole thermal drop between the thermoionic stage collector and the heat drain means, the materials used for the thermoelectric stage are such that their efficiency is fairly constant at a high level in a wide temperature range from the ambient temperature up to and over 800° C.

More specifically, the thermoelectric material may comprise selenides or tellurides of metals such as copper and silver and rare earths, such as gadolinium; such materials were recently developed by some industries and begin to become available on the market.

(e) The heat draining means function to transfer the heat from the thermoelectric stage to the atmosphere. It comprises a structure consisting of high thermal conductivity elements (possibly including heat guides) so arranged as to establish a good thermal contact between the cold junction of the thermoelectric stage and the atmosphere.

(f) The delivery and storage stage function is for adapting the generator's output to the external load. Specifically, the delivery and storage stage may fulfil the following functions:

(1) Mixing the dc outputs from the thermoionic and thermoelectric stage for making the power from the generator available on two leads. Such function can be obviously omitted when the appliances to be fed consist of two groups of different electrical characteristics.

(2) Connecting by means of conventional converters the dc output power from the generator into higher dc voltage or into ac voltage, according to the load.

(3) Checking, regulating and stabilizing the electric power output.

(4) Storing in conventional storage batteries the power from the generator not immediately demanded and delivering the stored power on demand.

(g) The pointing and following system functions maintain the concentrator in the sun's direction during its movement both daily and seasonally. The concentrator is therefore tiltable about two axes at right angles by means of a motor for each axis. The altitude deviations of the concentrator with respect to the sun are detected by a pair of photosensors the output of which controls a motor through a reaction electronic circuit for changing the altitude angle of the concentrator. Any deviations in azimuth of the concentrator with respect to the sun are similarly neutralized by means of a photosensor pair and a second motor with a related reaction electronic circuit.

The invention will be more clearly understood from the following description and attached drawings which illustrate a preferred embodiment thereof by way of example.

Figure 1:
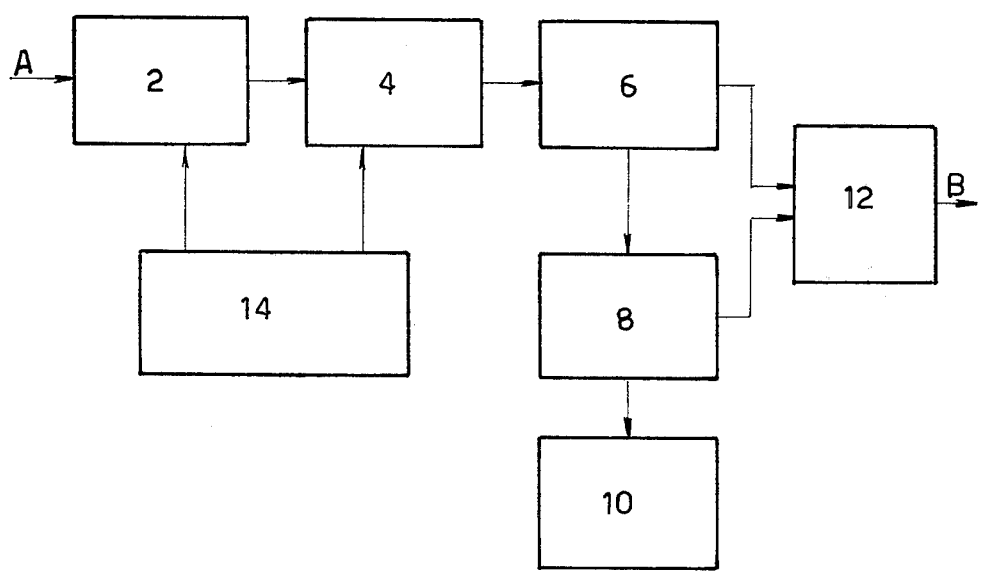
FIG. 1 shows a logic diagram of the generator according to this invention.
Figure 2:
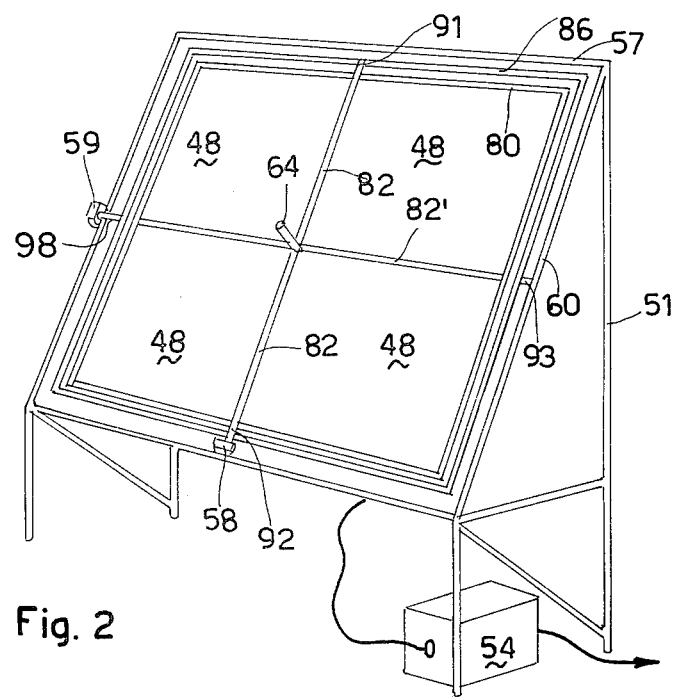
FIG. 2 shows a perspective view of the support structure of the generator.

With reference to FIG. 1, the radiant solar energy A is indicated which is admitted into the apparatus. The latter comprises a concentrator 2, a receiver 4, a thermoionic converter 6, a thermoelectric converter 8, a heat draining or disposal means 10, a delivery and storing stage of the electric power 12, and a pointing and following system 14. The produced electric power is indicated by B.

With reference to FIGS. 2, 3, 4, and 5, the generator of this invention, according to a preferred embodiment thereof, comprises four coplanar square shaped Fresnel lenses 48 mounted each in a quarter portion of a square frame 80 and by the peripheral frame, the four portions being defined by the crossbars 82, 82' at right angles. The axis perpendicular to the frame and passing through the center thereof will be called central axis. A pentagonal aluminium sheet 53 extends from each crossbar perpendicular to the other, two sides 53' of the pentagon being at right angles with respect to the frame plane and two other sides 53" converging toward a point located on said central axis, the fifth side of the pentagon lying in the frame plane.

At the crossing of the two sheets 53 a frustoconical unit 52 is located wherein the receiver, the thermoionic stage and the thermoelectric stage are housed. Sheets 53 have each a deep inverted V-shaped indentation for making room for unit 52 therein. At a certain distance from frame 80 a tubular polygonal flat structure 55 supports four circular convex mirrors 44 with such a setting that the sun's radiation from lenses 48 is directed thereby towards the center of frame 80. Four flat mirrors 56 are arranged around the central axis at a short distance from the convergence point of said convex mirrors 44 which flat mirrors direct the sun's radiation twowards the opening 52' of unit 52. Structure 55 is secured to sheets 53 and specifically at the two convergence points of sides 53' and 53" of each sheet.

The inlet opening of unit 52 is surrounded by an annular element or shield 71 which prevents any overheating of the exterior surface of unit 52 around the opening due to errors in aiming to the sun.

From the above it appeas that the optical systems within the four dihedral angles defined by sheets 53 are identical. Their common function is for focalizing the sun's radiation into the inlet opening of casing 52. It will be noted that by the above optical system a considerable reduction of the generator height and, as a consequence, of its cost is achieved.

Unit 52 (FIG. 3) comprises a metal shell 61 which defines a substantially conical well 94 provided with an opening 52' at its vertex and with a flat bottom. The flat bottom of shell 61 comprises a plate 96 made of a good heat conducting metal such as molybdenum of which the side opposite to the well has been treated with ion implantation and functions as the emitter electrode. Its optimum operating temperature is 1300° C. A relevant feature of this invention is thus realized whereby the thermoionic stage comprises a portion of the outer surface of the receiver.

The lateral walls of shell 61 are insulated withe respect to the outside by means of insulating space 69, wherein an insulation made of reflecting surfaces under vacuum is enclosed.

In front of electron emitter 72 collector electrode 73 of the conversion thermoelectric stage is disposed. Collector 73 comprises a titanium plate. The distance between the emitter electrode and the collector is about 0.5 mm. The space 74 between electrodes 72 and 73 is peripherally defined by a channellike wall 65. Wall 65 is made of a material capable of electrically insulating emitter 72 from collector 73.

A pressure of the order of a tor is maintained within space 74 by means of cesium vapours from a reservoir not shown and oxygen traces filtered thereinto through the titanium wall of which collector 73 is made.

The optimum operating temperature of the titanium collector is 650° C.

The maximum power density from the thermoionic stage is about 5 W/cm$^2$.

The cesium pressure within space 74 is determined by the cesium reservoir temperature; it is particularly important that such temperature be maintained within the range of values at which the thermoionic stage performs at its optimum.

According to a preferred embodiment of the invention, the cesium reservoir temperature is controlled automatically inasmuch as the reservoir is in thermal contact with the collector electrode and with the heat drain means through two elements which are made of material with respectively positive and negative thermal conductivity factor; an automatic compensation thermal divider being realized by such elements.

A plurality of couples 66 of thermoelectric material are in thermal contact with the lower surface of plate 73; each couple comprising a bar element of P-type material and a similar element of N-type material.

According to a known technique, the heads of the two bar elements of each couple are in electric contact to one another by means of side extensions at the level of said heads while all the bar elements and related extensions are in thermal contact with plate 73; the bottom end of one of the two elements of a couple being in electric contact through a side extension with the bottom end of a element of different type which partains to another couple of elements, while all the bottom ends of the elements and related extensions are in thermal contact with a wall 67 of high thermal conductivity material.

A layer 73' of electrically insulating but thermally conducting material is interposed between the element heads and plate 73, a similar layer 68 is interposed between the element bottom end and wall 67.

According to an important aspect of the invention, the thermoelectric conversion stage is located between the collector 73 itself of the thermoionic stage and the conducting wall 67. The latter is in thermal contact with sheets 53 which function for draining heat to the atmosphere.

In the preferred embodiment silver and copper selenide and gadolinium selenide are respectively used for the P-type elements and for the N-type elements while temperatures of 650° C. and of 80° C. are respectively adopted for an optimum operation with an efficiency higher than 10%.

The highly thermally conductive wall is made of anticorodal.

Wall 67 is surrounded by a rim 67' which projects upwards for a certain height and whose inner diameter is abundantly larger than the diameter of plate 73. The space 70 between rim 67' and the periphery of plate 73 and between the same rim and elements 66 is filled with a thermally insulating material chemically compatible with the semiconducting materials of the thermoelectric conversion stage.

Figure 3:
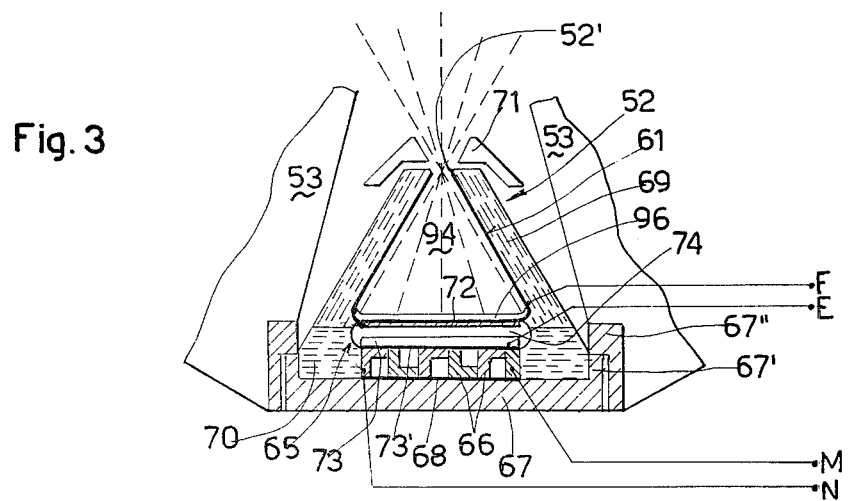
FIG. 3 shows a centerline cross-section of the hollow body coaxial with axis A—A of FIG. 5.

With letters F, E, M, N, of FIG. 3 the leads are indicated for taking the electric power produced by unit 52 out of the same.

For a ready assembly of unit 52 on sheet 53 the upright rim 67' of circular wall 67—as shown in FIG. 3—is provided with a external thread at the periphery thereof for engaging a complementary threading of the inner surface of a ring 67" to which sheets 53 are attached for instance by welding.

Figure 5:
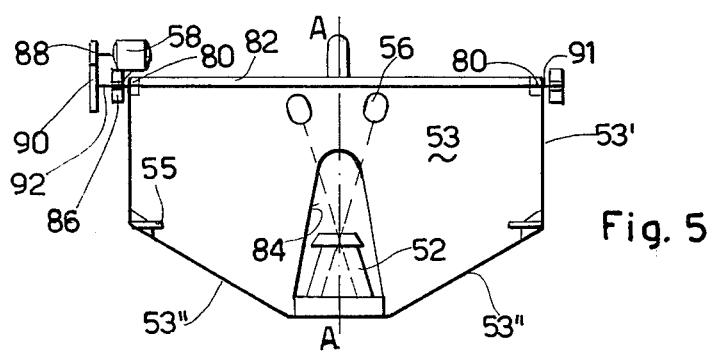
FIG. 5 shows a cross-section of the assembly of FIG. 4 along line V—V of the same figure.
Figure 4:
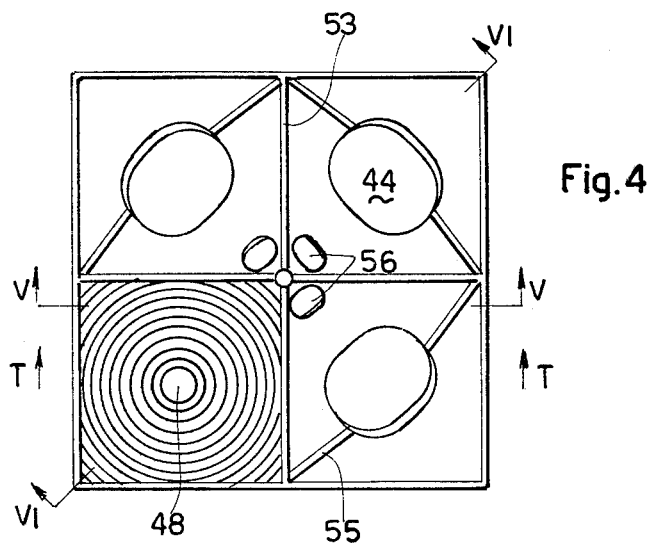
FIG. 4 shows the tiltable assembly of the generator projected on a plane parallel to the Fresnel lenses plane; three of the lenses being omitted for better clarity.
Figure 6:
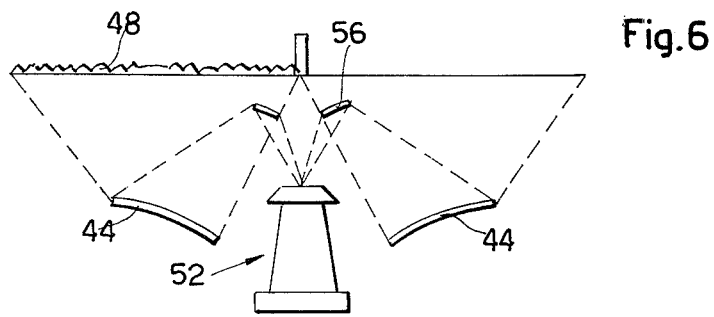
FIG. 6 shows a cross-section of the assembly of FIG. 4 along line VI—VI thereof.

With reference now to FIG. 5, one of the crossbars 82,82' of frame 80—specifically crossbar 82 in the illustrated embodiment—extends beyond the frame with two shafts 91,92' which are journalled in respective bearings carried on a second frame 86. To frame 86 an actuator 58—such as the electric motor shown in FIG. 5—is affixed of which a pinion 88 engages a gear 90 firmly mounted on shaft 92 of crossbar 82.

Two shafts 93,98 extend at right angles also from the midpoint of the two sides parallel to crossbar 82 of frame 86.

The two shafts of frame 86 are journalled in a third stationary frame 57 of which the supporting structure 51 of the generator is provided.

A second electric motor 59 is affixed to frame 57 the pinion of said motor meshing with a gear firmly mounted on shaft 98. A Cardan's suspension is thus realized of frame 80 on frame 57 whereby frame 80 can be moved in any direction within certain limits.

The structure 51 in the illustrated embodiment is a stationary framework for anchoring the apparatus to the ground; it has the shape of a reading desk inasmuch as an angle is included between said third frame 57 and the horizontal plane which is about equal to the latitude angle of the site where the generator is located.

The side of square frame 57 in the preferred embodiment is about 2 m inasmuch as square Fresnel lenses larger than 1 m are not economical nor easily handled.

At the crossing of crossbars 82,82' photosensors 64 of the pointing and following system are mounted by which the Fresnel lenses are kept constantly directed towards the sun for maximum catching of energy.

A delivery and storage stage (FIG. 2) is incorporated whereby the output powers from unit 52 are blended and transformed for feeding the load.

A preferred embodiment of the invention has thus been described. A number of modification and variants can be contributed thereto by the skilled in the art. For instance, the radiation beams from the four convex mirrors 44 can be directed into a receiver provided with four inlet openings one for each beam. such solution is simpler and cheaper than that illustrated even if it causes a greater loss of energy due to re-irradiation of energy through the inlet openings. Furthermore, tungsten or tantalum can be used in lieu of molybdenum as the structural material for the emitter and niobium or nickel can be used in lieu of titanium as structural material for the collector. Lastly, selenides or tellurides of metals other than those above recited can be used for the thermoelectric conversion stage.

All such variants and modifications are intended to be within the scope of the appended claims whenever they are made in the true spirit of the invention.

We claim:

1. An apparatus for directly converting the solar radiation into electric power which generator comprises a plurality of optical systems mechanically assembled together and arranged at constant angular distance about a central axis, which are maintained constantly pointed towards the sun, which systems focalize the sun radiation into the inlet opening of a hollow body provided with a flat wall facing said opening, the remaining walls of the body being thermally insulated with respect to the body outside, said flat wall being in direct thermal contact with two converters of heat into electric power disposed in thermal cascade, the first converter being a thermoionic converter and the second converter being a thermoelectric converter, the cold end of the thermoelectric converter being in direct thermal contact with a heat draining or disposal system to the atmosphere which draining system comprises a heat conducting plate at thermal contact with said cold end of the thermoelectric converter and a plurality of metal sheets connected to said plate.

2. An apparatus as claimed in claim 1, wherein each of said plurality of optical systems comprises a Fresnel lens, a convex mirror and a flat mirror at short distance from said central axis and so set as to direct the solar radiation from said convex mirror into the inlet opening of said hollow body, the latter being centered on said central axis.

3. An apparatus as claimed in claim 1, which comprises four identical optical systems each of which comprises a square shaped Fresnel lens coplanar with the others; each lens occupying a quarter of the surface defined by a square frame provided with two crossbars crossing at the center of said surface; a convex circular mirror carried on a polygonal flat structure and a flat mirror at short distance from said central axis and said frame.

4. An apparatus as claimed in claim 1, wherein said thermoionic converter comprises a molibdenum layer laid over the external surface of said flat wall of the hollow body and a titanium plate parallel to said flat wall at a short distance therefrom, the space between said layer and said plate being peripherally enclosed by a channer-like wall attached and sealed along one of its edges to the periphery of said molybdenun layer and along its other edge to the periphery of said titanium plate a casium vapour atmosphere being provided within said space mixed with oxygen traces.

5. An apparatus as claimed in claim 4 wherein said thermoelectric stage comprises a plurality of bars made of thermoelectric material one half of them being of the P type and one half of the N type, an end of each bar being in thermal contact with said titanium plate and the other end being in contact with said thermally conducting plate which is a part of said heat draining system.

6. An apparatus as claimed in claim 1, wherein the side walls of said hollow body are thermally insulated from the surrounding atmosphere by means of an insulation comprised of reflecting surfaces under vacuum.

7. An apparatus as claimed in claim 5, wherein the sides of said bars of thermoelectric material are thermally insulated from one another by means of an insulation chemically compatible with the semiconductor materials of said bars of P and N type.

8. An apparatus as claimed in claim 3, wherein said optical system, said hollow body and said heat draining system are fastened to said frame which surrounds the four Fresnel lenses which frame is mounted on a support structure through a Cardan's suspension, the frame being tiltable with respect to a second frame by means of a first actuator said second frame being also tiltable with respect to a corresponding stationary frame of said support structure by means of a second actuator, said actuators being controlled by a pointing device which responds to the sun's light.

9. An apparatus as claimed in claim 8, wherein said sheets of the heat draining system function as a connecting means of said Fresnel lenses frame to said hollow body and to said convex mirrors.

10. An apparatus as claimed in claim 4, wherein said oxygen traces within the thermoionic stage space are filtered through said titanium plate.

11. An apparatus as claimed in claim 4, wherein said molybdenum layer is treated with ion implantation.

12. An apparatus as claimed in claim 4, wherein a tungsten layer is laid over the external surface of said hollow body flat wall.

13. An apparatus as claimed in claim 4, wherein a tantalium layer is laid over the external surface of said hollow body flat wall.

14. An apparatus as claimed in claim 5, wherein the semiconductor P-type material comprises a selenide of silver and copper.

15. An apparatus as claimed in claim 5, wherein the semiconductor P-type material comprises a telluride of silver and copper.

16. An apparatus as claimed in claim 5, wherein said semiconductor N-type material is a rare earth selenide.

17. An apparatus as claimed in claim 5, wherein the semiconductor N-type material is a rare earth telluride.

* * * * *